(12) United States Patent
Braun

(10) Patent No.: US 6,327,173 B2
(45) Date of Patent: Dec. 4, 2001

(54) METHOD FOR WRITING AND READING A FERROELECTRIC MEMORY

(75) Inventor: Georg Braun, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/740,637

(22) Filed: Dec. 18, 2000

Related U.S. Application Data

(63) Continuation of application No. PCT/DE99/01689, filed on Jun. 9, 1999.

(30) Foreign Application Priority Data

Jun. 16, 1998 (DE) ................................................ 198 26 827

(51) Int. Cl.⁷ .................................................... G11C 11/22
(52) U.S. Cl. .......................................... 365/145; 365/149
(58) Field of Search .................................... 365/145, 149, 365/156, 189.04

(56) References Cited

U.S. PATENT DOCUMENTS

| 5,262,982 | 11/1993 | Brassington et al. | 365/145 |
| 5,666,305 | 9/1997 | Mihara et al. | 365/145 |
| 5,726,930 | * 3/1998 | Hasegawa et al. | 365/145 |
| 5,835,399 | * 10/1998 | Jeon | 365/145 |
| 6,118,688 | * 9/2000 | Hirano et al. | 365/145 |
| 6,215,693 | * 4/2001 | Chung et al. | 365/145 |

FOREIGN PATENT DOCUMENTS

| 0 767 464 A2 | 4/1997 | (EP) . |
| 0 928 004 A2 | 7/1999 | (EP) . |
| 410150157-A | * 6/1998 | (JP) . |

OTHER PUBLICATIONS

Fred P. Gnadinger: "High Speed Nonvolatile Memories Employing Ferroelectric Technology", 1989 IEEE Proceedings/VLSI and Computer Peripherals/VLSI, pp. 20–23.

* cited by examiner

*Primary Examiner*—Richard Elms
*Assistant Examiner*—Hien Nguyen
(74) *Attorney, Agent, or Firm*—Herbert L. Lerner; Laurence A. Greenberg; Werner H. Stemer

(57) ABSTRACT

A method is described for reading and writing a ferroelectric memory. In ferroelectric memories, changes in a hysteresis curve on account of aging of the ferroelectric material are reduced or prevented by virtue of the fact that during reading and writing a complementary state is also written in and a capacitor voltage is reduced to 0 V before a memory cell is deactivated.

4 Claims, 3 Drawing Sheets

METHOD FOR WRITING AND READING A FERROELECTRIC MEMORY

CROSS-REFERENCE TO RELATED APPLICATION

This is a continuation of copending International Application PCT/DE99/01689, filed Jun. 9, 1999, which designated the United States.

BACKGROUND OF THE INVENTION

Field of the Invention

The invention relates to a writing and reading method for a non-volatile memory having a ferroelectric capacitor. The material between the capacitor plates has a hysteresis behavior and the non-volatile memory behavior is based on remanent states that are maintained even without externally applied voltage. In order to read out the stored states, a voltage is applied externally to the capacitor and a sense amplifier evaluates the shifted quantity of charge which is dependent on the originally stored state, destructive reading taking place which makes it necessary to write the information back. Ferroelectric materials used typically include PZT (lead zirconium titanate), PLZT (lanthanum-doped PZT), SBT (strontium bismuth tantalate) or SBTN (niobium-doped SBT). Such materials exhibit changes in the hysteresis curve caused by aging. Measurements on such ferroelectric thin films have shown that the hysteresis curve, that is to say the relationship between polarization and an applied voltage, shifts when a stored state is maintained over a relatively long time. The latter effect is referred to as an "imprint", a static imprint and a dynamic imprint being possible.

In a static imprint, the voltage is not changed at all or is changed only over a relatively long period of time, and, in a dynamic imprint, a transition takes place from a remanence state to saturation and then back to the same remanence state, this typically occurring when the same information item is repeatedly read and written back. In order to achieve reliable detection of the memory states, that is to say a sufficient charge difference during reading, it is possible to enlarge the cell capacitor, but this leads to the chip area being enlarged in a disadvantageous manner.

Published, European Patent Application EP 0 767 464, U.S. Pat. No. 5,262,982 and IEEE Proceedings/VLSI and Computer Peripherals/VLSI and Microelectronics, Application in Intelligent Peripherals and Their Interconnection Networks, May 8–12, 1989, pages 1 to 20 to 1 to 23, disclose ferroelectric memories and an associated reading method in which a reduction of the service life on account of the aging properties of the ferroelectric material is avoided as far as possible, for example by avoiding polarization reversal. What is involved in this case is aging caused by frequent changing of the memory state; in the case of the imprint effect, by contrast, to an extent aging occurs because the changing is too infrequent.

SUMMARY OF THE INVENTION

It is accordingly an object of the invention to provide a method for writing and reading a ferroelectric memory that overcomes the above-mentioned disadvantages of the prior art methods, in which reliable reading of stored information is made possible over a relatively long period of time despite the aging properties of the ferroelectric material (imprint) and without requiring additional area for forming the memory.

With the foregoing and other objects in view there is provided, in accordance with the invention, a writing method which includes the steps of writing in of an information item which is complementary to an actual information item in a ferroelectric memory; and writing in the actual information item in the ferroelectric memory.

The invention relates to preventing or at least reducing a dynamic imprint by virtue of the fact that all states of the hysteresis curve are always run through a writing or reading cycle.

In accordance with an added feature of the invention, there is the step of writing in with a write voltage equal to zero in the ferroelectric memory subsequently to the writing in of the actual information.

With the foregoing and other objects in view there is further provided, in accordance with the invention, a method for reading a ferroelectric memory. The method includes performing a first reading process that proceeds from a positive/negative polarity. In which a read voltage is applied such that the read voltage initially becomes positive/negative, then negative/positive and once again positive/negative before it finally assumes a value of zero again at an end of a reading operation. A second reading process is performed which proceeds from a negative/positive polarity, given that the read voltage is equal to zero, the read voltage is applied such that the read voltage is initially positive/negative and then negative/positive before it finally assumes the value of zero again at the end of the reading operation.

In accordance with a concomitant feature of the invention, the first reading process and second reading process last an equivalent length of time because the read voltage is negative/positive for a longer period in the second reading process than in the first reading process.

Other features which are considered as characteristic for the invention are set forth in the appended claims.

Although the invention is illustrated and described herein as embodied in a method for writing and reading a ferroelectric memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
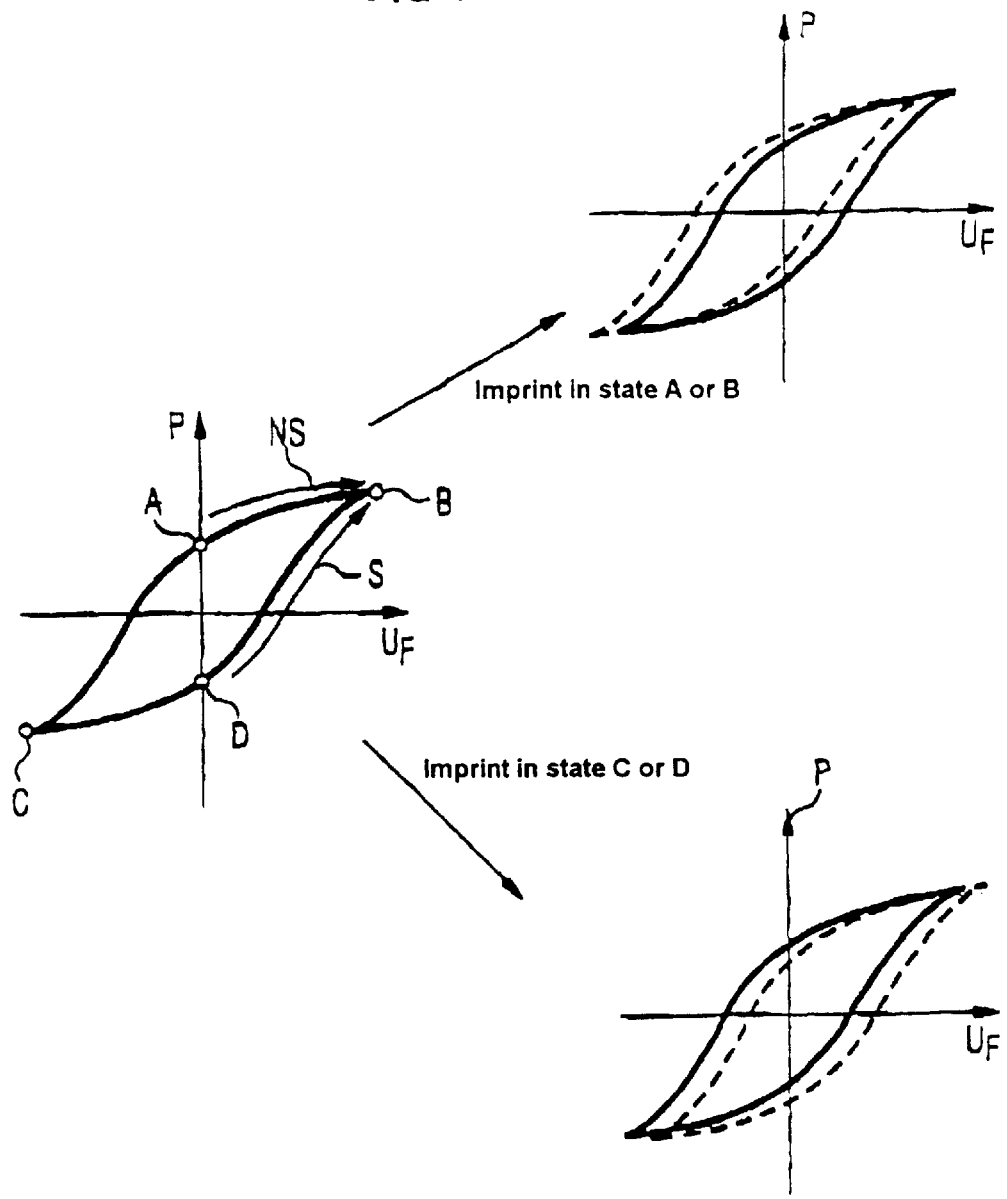
FIG. 1 is a hysteresis diagram and its changes due to an imprint.

In all the figures of the drawing, sub-features and integral parts that correspond to one another bear the same reference symbol in each case. Referring now to the figures of the drawing in detail and first, particularly, to FIG. 1 thereof, there is shown a hysteresis curve for a ferroelectric dielectric of a memory cell capacitor. A polarization P is plotted against an externally applied voltage $U_F$. A positive remanence value at the voltage $U_F=0$ is designated by A and a negative remanence value at the voltage $U_F=0$ is designated by D. A positive saturation value is designated by B and a negative saturation value is designated by C. A non-switching transition NS takes place for example between the points A and B and a switching transition S takes place for example between the points D and B. A smaller quantity of charge is shifted in the case of the non-switching transition NS than in the case of the switching transition S. Furthermore, FIG. 1 reveals that the hysteresis curve is shifted in the direction of negative voltage values if predominantly positive polarization values occur, and that the hysteresis curve is shifted in the direction of positive voltage values if predominantly negative polarization values occur. Therefore, with increasing aging of the memory module, the signal assessed by the sense amplifier decreases or that, in the extreme case, it even happens that the signal read out is assessed incorrectly. A further problem is posed by the shift in the coercive voltages, that is to say that voltages at which the hysteresis has the polarity 0, the shift being connected with the imprint. In order to be able to drive the ferroelectric material to saturation to a sufficient extent, the applied voltage must exceed the coercive voltage by a specific factor, e.g. by a factor of 2. If the magnitude of a coercive voltage is greatly increased by an imprint, then an occurrence that may perfectly well be manifested in low-voltage applications is that the voltage $U_F$ applied to the ferroelectric capacitor no longer suffices to drive the material to saturation. Therefore, a specific remanent state A or D can no longer be written reliably to the storage capacitor, which can likewise lead to incorrect assessment during the reading of the capacitor.

Figure 2A:
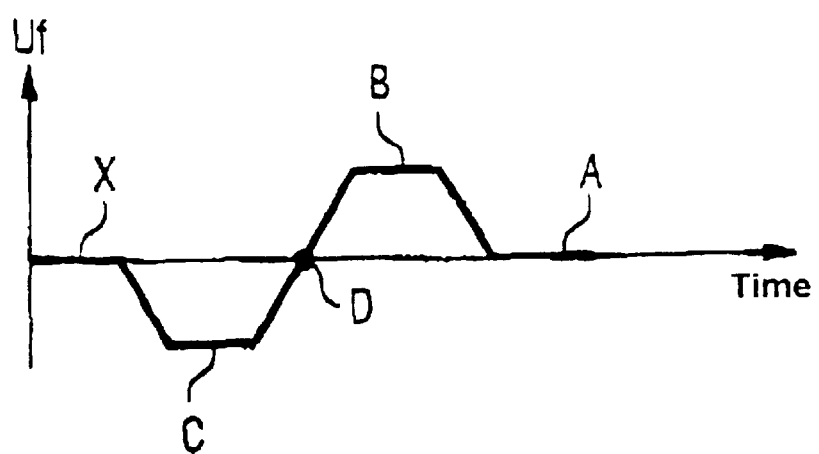
FIGS. 2A–2C are graphs for elucidating a writing method according to the invention.
Figure 2B:
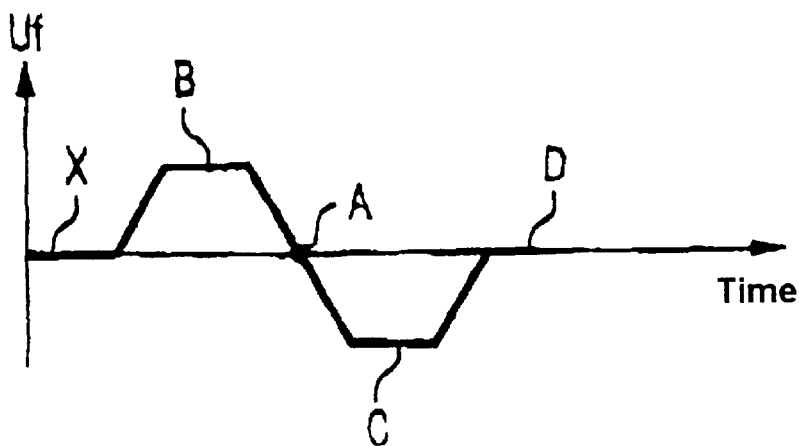

FIG. 2A shows the temporal profile of the voltage $U_F$ during the writing in, according to the invention, of the state A proceeding from an arbitrary state X. In this case, in accordance with the designations of FIG. 1, the states C, D, B and finally A are assumed in order proceeding from the state X. FIG. 2B correspondingly shows the temporal profile of the voltage $U_F$ for writing in the state D, the states B, A, C and D being assumed in order proceeding from the arbitrary state X.

In accordance with the diagram of FIG. 1, the voltage in $U_F$ is negative in the state C and positive in the state B.

Figure 2C:
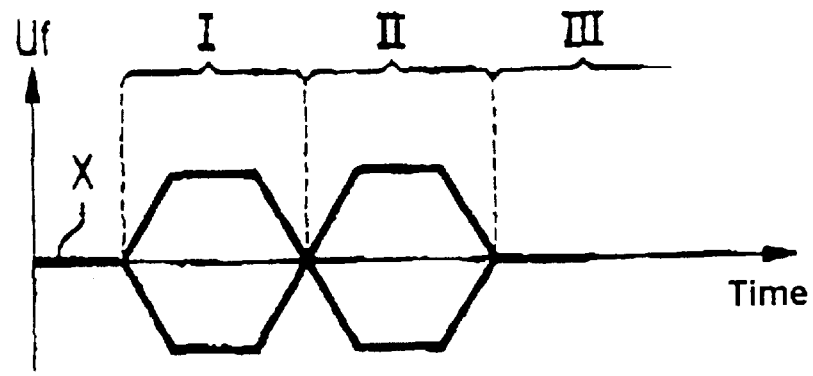

In FIG. 2C, the writing method is divided into three sections I–III independently of the state to be written in. A complementary information item is written in in step I for the purpose of eliminating the material aging with regard to imprint. The actual information item is written in in the second step, and a return to the voltage $U_F=0$ takes place in step III in order to achieve the remanent states A and D and in order to avoid a static imprint.

Figure 3A:
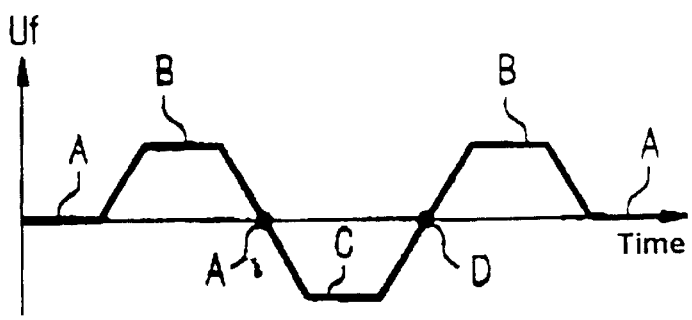
FIGS. 3A–3D are graphs for elucidating a reading/writing method according to the invention.

FIG. 3A illustrates the profile of $U_F$ for reading and writing back the state A. In order to read the state of the material, it is first brought to positive saturation, that is to say to the state B, where the charge that has flowed is assessed by a sense amplifier, the latter identifying the state A as the stored state on account of the smaller charge flowing in the non-switching transition NS than in the switching transition S. In order to eliminate the imprint, the state C is then assumed by a negative voltage $U_F$. In order then to write the starting state A back again, the state B is then assumed with a positive voltage $U_F$, this state ending in the state A after $U_F$ has decreased to 0 V.

Figure 3B:
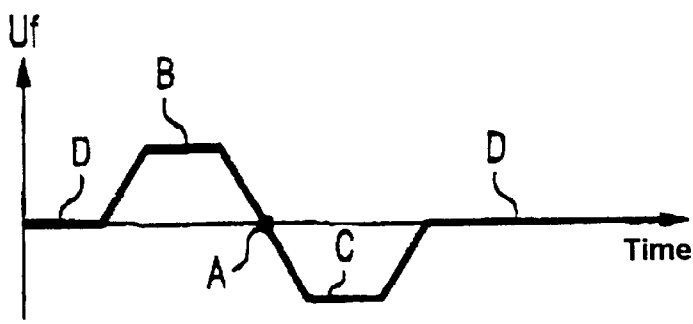

FIG. 3B illustrates the temporal profile of the voltage $U_F$ for reading and writing back the state D. In order to read the state of the material in the cell capacitor, it is first brought to positive saturation, that is to say to the state B, the positive saturation simultaneously eliminating the imprint in the material since the positive saturation is complementary to the previously stored negative remanence, that is to say the state D. In the state B, the charge that has flowed is assessed, the state D being identified as the stored state on account of the larger quantity of charge in the switching transition S than in the non-switching transition NS. In order to write the destroyed information, that is to say the state D, back again, the state C is assumed by a negative value of $U_F$, which state ends in the state D after $U_F$ has decreased to 0 V.

Figure 3C:
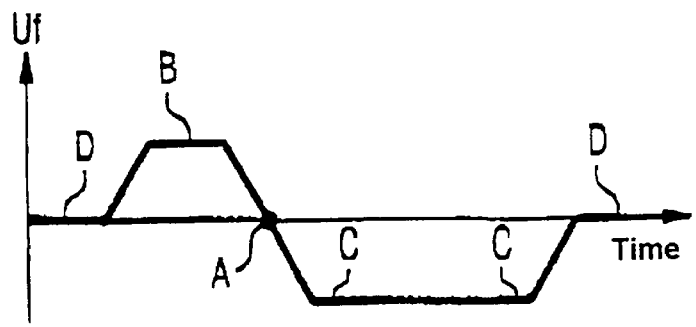
Figure 3D:
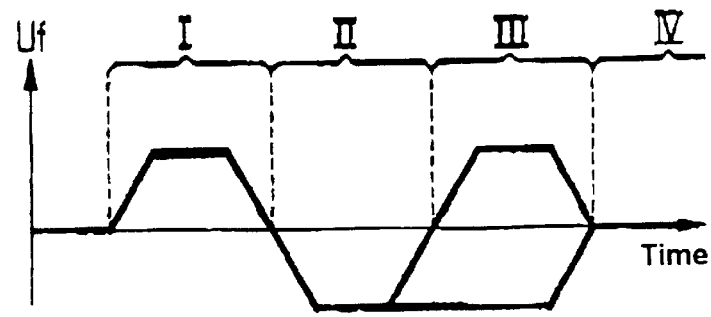

In order, in an advantageous manner, to be able to configure the reading operation identically for both starting states A and D, it is the case that, as shown in FIG. 3C, the writing back of the information by way of the negative saturation, that is to say the state C, is prolonged by a cycle period and the entire reading operation can be regarded, for both starting states A and D, as shown in FIG. 3D, into four successive sections I . . . IV which last the same length of time.

What takes place in step I is a read-out and assessment of the information in the state B, the imprint simultaneously being eliminated if the starting state was D. In step II the imprint is eliminated for the case where the starting stage was A or the information is written back if the starting state was B. In step III, the information is written back for both starting states, that is to say for the state A or D. Finally, in step IV, the voltage across the ferroelectric capacitor is reduced to $U_F=0$ V for the purpose of avoiding a static imprint.

The method according to the invention can be carried out not only with the positive saturation state B but also with the negative saturation state C, the voltage profiles for writing and reading merely having a different sign.

Ideally, the magnitude of the voltage $U_F$ is identical in the state B and in the state C and leads to the largest reduction or to prevention of the dynamic imprint.

I claim:

1. A writing method, which comprises the steps of:
    writing in of an information item which is complementary to an actual information item in a ferroelectric memory; and
    writing in the actual information item in the ferroelectric memory.

2. The writing method according to claim 1, which comprises writing in with a write voltage equal to zero in the ferroelectric memory subsequently to the writing in of the actual information.

3. A method for reading a ferroelectric memory, which comprises the steps of:
    performing a first reading process which proceeds from a positive/negative polarity, in which a read voltage is applied such that the read voltage initially becomes positive/negative, then negative/positive and once again positive/negative before it finally assumes a value of zero again at an end of a reading operation; and
    performing a second reading process which proceeds from a negative/positive polarity, given that the read voltage is equal to zero, the read voltage is applied such that the read voltage is initially positive/negative and then negative/positive before it finally assumes the value of zero again at the end of the reading operation.

4. The reading method according to claim 3, wherein the first reading process and second reading process last an equivalent length of time because the read voltage is negative/positive for a longer period in the second reading process than in the first reading process.

* * * * *